United States Patent
Kvanvig et al.

(10) Patent No.: US 6,501,290 B2
(45) Date of Patent: *Dec. 31, 2002

(54) DIRECT TO CHUCK COOLANT DELIVERY FOR INTEGRATED CIRCUIT TESTING

(75) Inventors: Thomas A. Kvanvig, Phoenix, AZ (US); Martin M. Maxwell, Boise, ID (US); Tom Birk, Gilbert, AZ (US); Dave Clay, Phoenix, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/408,891

(22) Filed: Sep. 29, 1999

(65) Prior Publication Data

US 2002/0011862 A1 Jan. 31, 2002

(51) Int. Cl.⁷ .............................................. G01R 31/02
(52) U.S. Cl. ..................................... 324/760; 324/158.1
(58) Field of Search ............................. 324/760, 158.1, 324/758, 754, 755

(56) References Cited

U.S. PATENT DOCUMENTS

| | | | |
|---|---|---|---|
| 3,710,251 A | * | 1/1973 | Hagge et al. ............ 324/158.1 |
| 3,761,808 A | * | 9/1973 | Ryan ....................... 324/158.1 |
| 4,782,291 A | * | 11/1988 | Blandin ................... 324/158.1 |
| 4,791,364 A | | 12/1988 | Kufis et al. |
| 4,820,976 A | * | 4/1989 | Brown ..................... 324/158.1 |
| 4,870,355 A | | 9/1989 | Kufis et al. |
| 4,945,302 A | | 7/1990 | Janum |
| 4,954,774 A | * | 9/1990 | Binet ....................... 324/158.1 |
| 4,982,153 A | | 1/1991 | Collins et al. |
| 5,084,671 A | * | 1/1992 | Miyata et al. ........... 324/158.1 |
| 5,115,858 A | | 5/1992 | Fitch et al. |
| 5,198,753 A | | 3/1993 | Hamburgen |
| 5,397,997 A | | 3/1995 | Tuckerman et al. |
| 5,451,884 A | * | 9/1995 | Sauerland ................ 324/760 |
| 5,847,293 A | | 12/1998 | Jones |
| 5,847,366 A | | 12/1998 | Grunfeld |
| 6,072,325 A | * | 6/2000 | Sano ........................ 324/758 |
| 6,191,599 B1 | * | 2/2001 | Stevens .................... 324/760 |
| 6,288,561 B1 | * | 9/2001 | Leedy ...................... 324/760 |

OTHER PUBLICATIONS

Marston, Kenneth C., and Glenn, G. Daves, "Thermal Management of High Power Single and Multi–Chip Modules During Test and Burn–In", Third Annual Manufacturing Test, SemiconWest, pp. 140–149 (1994).

* cited by examiner

Primary Examiner—Michael Sherry
Assistant Examiner—Jimmy Nguyen
(74) Attorney, Agent, or Firm—Blakely, Sokoloff, Taylor & Zafman LLP

(57) ABSTRACT

A device is loaded in a test chamber. The device is positioned for support on a chuck in a non-test position in the test chamber. The device is tested in the test chamber. The chuck is positioned in a test position in the test chamber to place the device in electrical contact with a test apparatus. Coolant is delivered to a heat sink supported by the chuck near the device prior to testing the device and while testing the device. Coolant is delivered to the heat sink through flexible tubing coupled to the chuck as the chuck moves from the non-test position to the test position.

20 Claims, 2 Drawing Sheets

DIRECT TO CHUCK COOLANT DELIVERY FOR INTEGRATED CIRCUIT TESTING

BACKGROUND OF THE INVENTION

1. Field of the Invention

The present invention relates generally to the field of integrated circuit (IC) testing. More particularly, the present invention relates to the field of thermal management for IC testing.

2. Description of Related Art

As part of the manufacturing process, integrated circuits (ICs) typically undergo a variety of tests, including an environmental test where the electrical performance of each IC is monitored in a temperature controlled chamber by a test apparatus. A chuck is typically used to position the IC within the chamber relative to the test apparatus such that one or more contact areas of the IC are placed in electrical contact with the test apparatus. Information pertaining to the electrical performance of each IC is gathered during the test and then used to separate good ICs from bad ICs and to categorize the ICs according to their respective operating frequency. This process is commonly referred to as binning out.

As the junction temperature of an IC rises, the frequency at which the IC operates decreases. Accordingly, ICs tested at varying temperatures may not be appropriately separated or binned. If the IC is tested at too high of a temperature, the IC may be unnecessarily downgraded into a lower frequency bin. If the IC is tested at too low of a temperature, the IC may be improperly upgraded into a higher frequency bin.

Typical environmental tests use forced air convection techniques to cool the chuck while in a retracted or non-test position. Cooling the chuck in this manner helps cool the IC prior to testing and therefore helps avoid the junction temperature of the IC from rising too high while being tested.

BRIEF SUMMARY OF THE INVENTION

A device is loaded in a test chamber. The device is tested in the test chamber. Coolant is delivered near the device prior to testing the device and while testing the device.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for direct to chuck coolant delivery for integrated circuit testing. In the following description, details are set forth such as specific materials, etc., in order to provide a thorough understanding of the present invention. It will be evident, however, that the present invention may be practiced without these details. In other instances, well-known apparatus, techniques, etc., have not been described in particular detail so as not to obscure the present invention.

Direct to chuck coolant delivery helps regulate the temperature of an integrated circuit (IC) device for testing.

Figure 1:
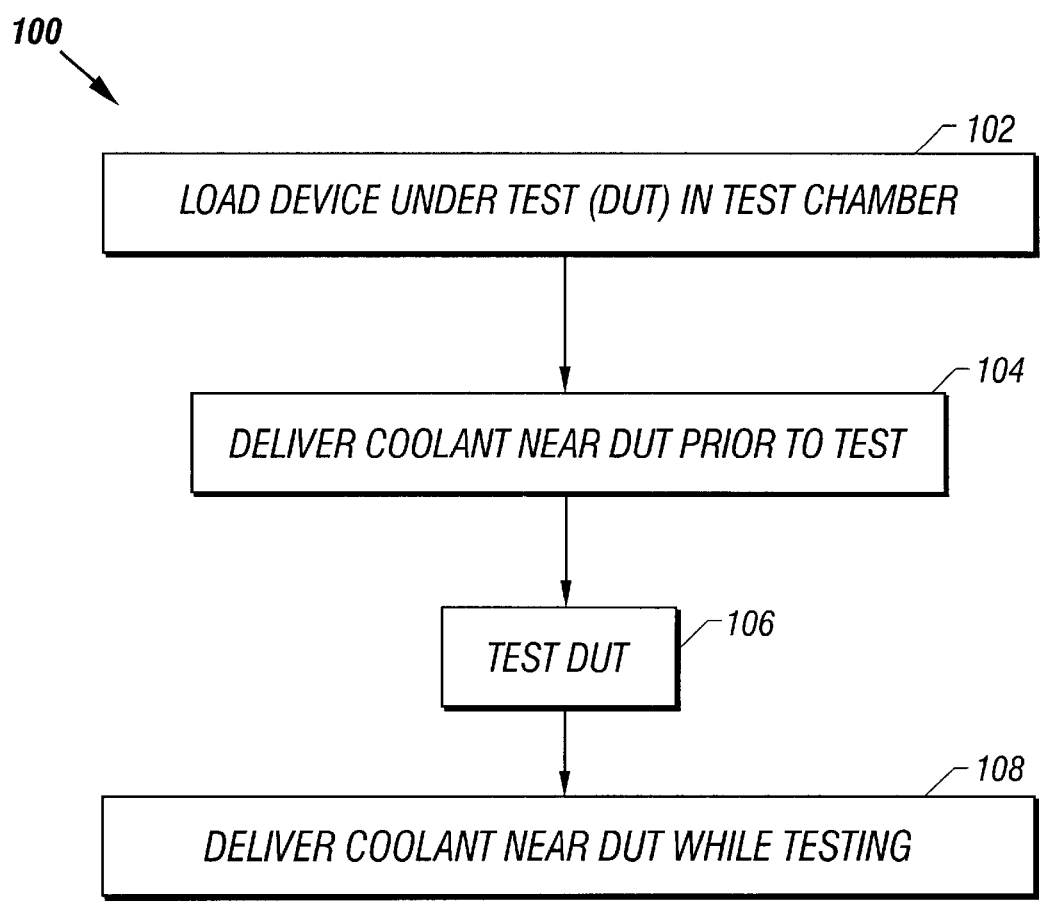
FIG. 1 illustrates, for one embodiment, a flow diagram for coolant delivery for integrated circuit testing.

FIG. 1 illustrates, for one embodiment, a flow diagram 100 for coolant delivery for device testing. As illustrated in FIG. 1, a device under test (DUT) is loaded 102 in a test chamber. The DUT may comprise any suitable device, such as an IC device for example. Coolant is delivered 104 near the DUT prior to testing the DUT. The DUT is tested 106 in the test chamber. Coolant is delivered 108 near the DUT while the DUT is tested.

For one embodiment, the DUT is initially loaded in a non-test position in the test chamber, and coolant is delivered near the DUT while in the non-test position. The DUT is then positioned in a test position in the test chamber to test the DUT, and coolant is delivered near the DUT while in the test position.

Any suitable coolant may be delivered near the DUT. One suitable gas coolant is air. Suitable liquid coolants include water and antifreeze, for example. Coolant is delivered near the DUT to help minimize or avoid any rise in temperature of the DUT while the DUT is tested. Coolant is delivered near the DUT prior to testing to help initialize the temperature of the DUT for testing. For one embodiment, coolant is delivered to a heat slug or sink positioned near the DUT to help draw heat from the DUT. Where the DUT comprises an IC device, for example, coolant may be delivered near the IC device to help minimize or avoid any rise in the junction temperature of the IC device while the IC device is tested and therefore help improve yield and bin splits. Coolant may be delivered at a predetermined set point temperature, for example, to help minimize or avoid any rise in the junction temperature of the IC device beyond the set point temperature. Compared to using typical forced air convection techniques only prior to testing the DUT, delivering coolant near the DUT both prior to and during testing better regulates the temperature of the DUT for testing.

Figure 2:
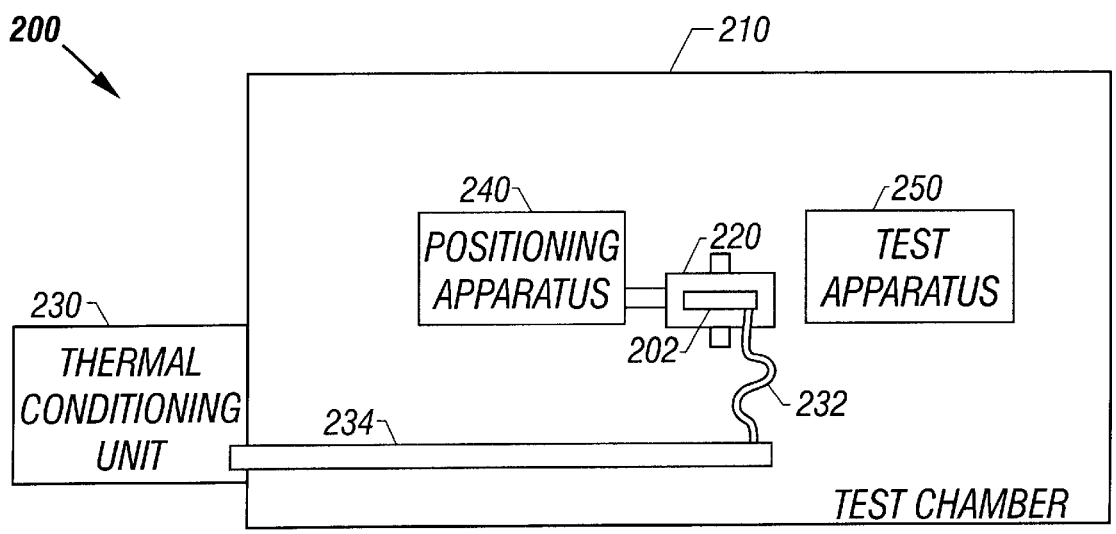
FIG. 2 illustrates, for one embodiment, a block diagram of a test system for performing direct to chuck coolant delivery for integrated circuit testing.

Any suitable system may be used for delivering coolant for DUT testing in accordance with flow diagram 100. For one embodiment, a test system 200 as illustrated in FIG. 2 may be used.

Test system 200 comprises a test chamber 210 to help regulate the test environment for a DUT 202. In loading DUT 202 into test chamber 210, DUT 202 is positioned for support by a chuck 220 in a retracted or non-test position in test chamber 210. Chuck 220 may be configured in any suitable manner to support DUT 202. Chuck 220 for one embodiment holds DUT 202 using vacuum pressure. A thermal conditioning unit 230 supplies coolant to chuck 220 through a flexible tubing 232 while chuck 220 is in the non-test position. Delivering coolant to chuck 220 while in the non-test position helps initialize the temperature of DUT 202 for testing.

Tubing 232 is coupled to thermal conditioning unit 230 by a manifold 234 and is coupled to chuck 220 to deliver coolant near DUT 202. Tubing 232 may comprise any suitable flexible material that may depend, for example, on the coolant to be delivered through tubing 232. For one embodiment, tubing 232 comprises silicon to deliver air. Tubing 232 for another embodiment may comprise a suitable fiber-reinforced material to deliver air or a suitable liquid coolant, for example.

Chuck positioning apparatus 240 positions chuck 220 in a test position to place DUT 202 in electrical contact with a test apparatus 250 in test chamber 210. Chuck positioning apparatus 240 may position chuck 220 in any suitable manner, and chuck 220 may support DUT 202 in any suitable manner for testing DUT 202. DUT 202 and test apparatus 250 may be configured in any suitable manner to provide electrical contact between DUT 202 and test apparatus 250. Test apparatus 250 may test DUT 202 in any suitable manner. Thermal conditioning unit 230 supplies coolant to chuck 220 through tubing 232 as chuck 220 moves from the non-test position to the test position and while chuck 220 is in the test position and DUT 202 is tested. Delivering coolant to chuck 220 while in the test position helps draw heat from DUT 202 while DUT 202 is tested and therefore helps minimize or avoid any rise in temperature of DUT 202 while DUT 202 is tested. As tubing 232 is flexible, tubing 232 remains coupled to chuck 220 for coolant delivery as chuck positioning apparatus 240 moves chuck 220 between the non-test and test positions.

When testing is complete, chuck positioning apparatus 240 moves chuck 220 from the test position to the non-test position to allow DUT 202 to be removed from test chamber 210. Thermal conditioning unit 230 may optionally continue to supply coolant to chuck 220 after testing DUT 202 to help remove any residual heat from chuck 220 for future testing.

Figure 3:
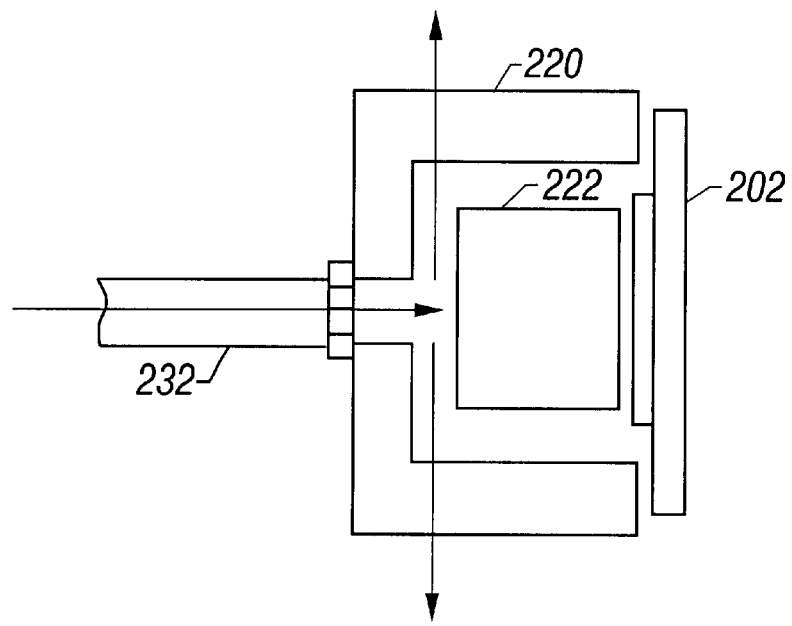
FIG. 3 illustrates, for one embodiment, a block diagram of an open loop direct to chuck coolant gas delivery.

Test system 200 may deliver any suitable coolant to chuck 220 in any suitable manner to help cool DUT 202. For one embodiment, as illustrated in FIG. 3, test system 200 delivers a coolant gas, such as air for example, to a heat slug or sink 222 supported by chuck 220 near or adjacent DUT 202 in an open loop system. The coolant gas is directed to flow from tubing 232 at heat sink 222 and exhausts from chuck 220 into test chamber 210. Chuck 220 may be configured in any suitable manner to support heat sink 222, to support DUT 202 such as by using vacuum pressure for example, to direct coolant gas from flexible tubing 232 to heat sink 222, and to exhaust that gas from chuck 220 into test chamber 210. Heat sink 222 may have any suitable shape and may be formed of any suitable material. Tubing 232 may be coupled to chuck 220 in any suitable manner, such as by a tube fitting for example.

Figure 4:
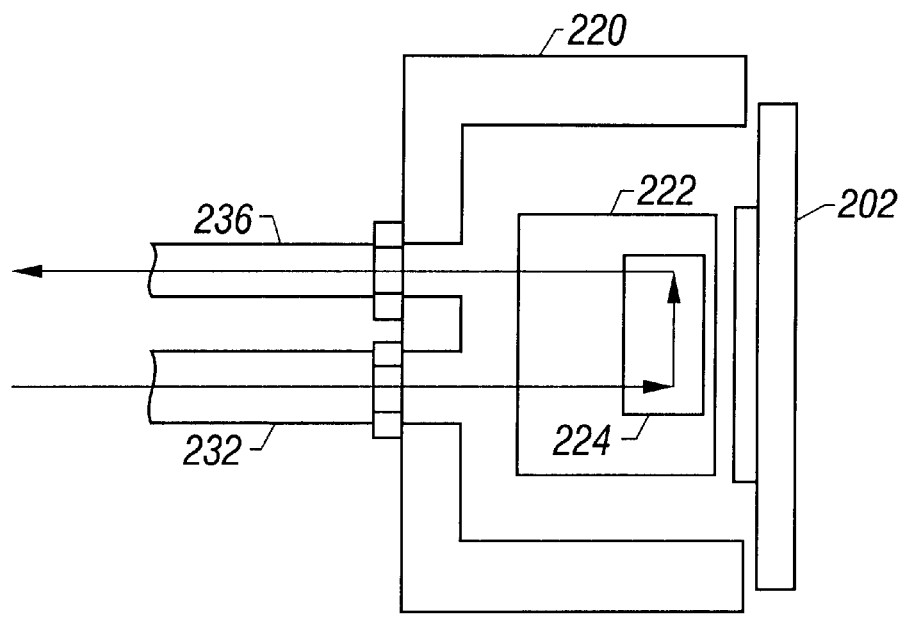
FIG. 4 illustrates, for one embodiment, a block diagram of a closed loop direct to chuck coolant delivery.

For another embodiment, as illustrated in FIG. 4, test system 200 delivers a coolant, whether gas or liquid, to heat sink 222 supported by chuck 220 near or adjacent DUT 202 in a closed loop system. The coolant is directed to flow from tubing 232 into a reservoir 224 within, near, or adjacent heat sink 222 and to return to thermal conditioning unit 230 through other suitable flexible tubing 236. Reservoir 224 may be defined in any suitable manner by chuck 220 and/or heat sink 222, for example. Chuck 220 may be configured in any suitable manner to support heat sink 222, to support DUT 202 such as by using vacuum pressure for example, to direct coolant from flexible tubing 232 to reservoir 224, and to direct coolant from reservoir 224 to flexible tubing 236. Heat sink 222 may have any suitable shape and may be formed of any suitable material. Tubing 232 and 236 may each be coupled to chuck 220 in any suitable manner, such as by a tube fitting for example.

By directing coolant at a predetermined temperature to heat sink 222, test system 200 attempts to maintain heat sink 222 at that temperature and induce a thermal gradient between heat sink 222 and DUT 202. Such a gradient develops a transfer path for the heat generated by DUT 202 as DUT 202 is tested.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
    loading a device in a test chamber to position the device for support on a chuck in a non-test position in the test chamber;
    positioning the chuck in a test position in the test chamber to place the device in electrical contact with a test apparatus;
    testing the device in the test chamber; and
    delivering a coolant prior to testing the device and while testing the device, wherein the coolant is delivered while the chuck is in the non-test position and also while the chuck is in the test position from a thermal conditioning unit to a reservoir of the chuck and to a heat sink supported by the chuck near the device through flexible tubing coupled to the chuck.

2. The method of claim 1, wherein the device is an integrated circuit device.

3. The method of claim 1, wherein the delivering includes delivering air, water, or antifreeze to the heat sink.

4. The method of claim 1, wherein the chuck supports the device adjacent the heat sink.

5. The method of claim 1, comprising exhausting the coolant into the test chamber from the chuck.

6. The method of claim 1, wherein the delivering includes directing the coolant in a closed loop system from the reservoir to the thermal conditioning unit through other flexible tubing coupled to the chuck.

7. An apparatus comprising:
    a chuck to support a heat sink and a device in a test chamber, wherein the chuck has a reservoir;
    positioning mechanism coupled with the chuck to position the chuck in a non-test position and in a test position in the test chamber; and
    a thermal conditioning unit to deliver a coolant while the chuck is in the non-test position and also while the chuck is in the test position, wherein the coolant is delivered from the thermal conditioning unit to a reservoir of the chuck and to a heat sink supported by the chuck near the device through flexible tubing coupled to the chuck.

8. The apparatus of claim 7, wherein the thermal conditioning unit is coupled to the flexible tubing to supply the coolant to the heat sink.

9. The apparatus of claim 7, comprising test mechanism to test the device, the positioning mechanism to place the device in electrical contact with the test mechanism when the chuck is in the test position.

10. The apparatus of claim 7, wherein the device is an integrated circuit device.

11. The apparatus of claim 7, wherein the flexible tubing is to deliver air, water, or antifreeze to the heat sink.

12. The apparatus of claim 7, wherein the chuck is to support the device adjacent the heat sink.

13. The apparatus of claim 7, wherein the chuck is to exhaust the coolant into the test chamber.

14. The apparatus of claim 7, comprising other flexible tubing coupled to the chuck to direct the coolant in a closed loop system from the reservoir to the thermal conditioning unit.

15. A system comprising:

a test chamber;

a chuck to support a heat sink and a device in the test chamber, wherein the chuck has a reservoir;

test apparatus to test the device;

positioning apparatus coupled with the chuck to position the chuck in a non-test position and in a test position in the test chamber, the positioning apparatus to place the device in electrical contact with the test apparatus when the chuck is in the test position; and a thermal conditioning unit coupled to flexible tubing to deliver a coolant while the chuck is in the non-test position and also while the chuck is in the test position, wherein the coolant is delivered from the thermal conditioning unit to a reservoir of the chuck and to a heat sink supported by the chuck near the device through the flexible tubing coupled to the chuck.

16. The system of claim 15, wherein the device is an integrated circuit device.

17. The system of claim 15, wherein the tubing is to deliver air, water, or antifreeze to the heat sink.

18. The system of claim 15, wherein the chuck to is support the device adjacent the heat sink.

19. The system of claim 15, wherein the chuck is to exhaust the coolant into the test chamber.

20. The system of claim 15, comprising other flexible tubing coupled to the chuck to direct the coolant in a closed loop system from the reservoir to the thermal conditioning unit.

* * * * *